(12) United States Patent  
Tanaka et al.

(10) Patent No.: US 7,723,837 B2  
(45) Date of Patent: May 25, 2010

(54) SEMICONDUCTOR DEVICE

(75) Inventors: Takekazu Tanaka, Kanagawa (JP); Ikuo Komatsu, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 422 days.

(21) Appl. No.: 11/334,373

(22) Filed: Jan. 19, 2006

(65) Prior Publication Data

US 2006/0170113 A1 Aug. 3, 2006

(30) Foreign Application Priority Data

Jan. 31, 2005 (JP) .............................. 2005-023049

(51) Int. Cl.
*H01L 23/02* (2006.01)
(52) U.S. Cl. ...................... 257/698; 257/678; 257/776; 257/E23.009
(58) Field of Classification Search ................ 257/678, 257/698, 776, 300–399, E23.009
See application file for complete search history.

(56) References Cited

U.S. PATENT DOCUMENTS

| | | | |
|---|---|---|---|
| 5,703,405 | A | 12/1997 | Zeber |
| 5,872,377 | A | 2/1999 | Jeon |
| 6,133,634 | A | 10/2000 | Joshi |
| 6,489,181 | B2 | 12/2002 | Kado et al. |
| 2002/0155642 | A1 * | 10/2002 | Noquil et al. ................ 438/125 |
| 2003/0102568 | A1 * | 6/2003 | Tomishima .................. 257/777 |
| 2003/0173676 | A1 | 9/2003 | Horikawa |

FOREIGN PATENT DOCUMENTS

| | | | |
|---|---|---|---|
| CN | 1148274 | A | 4/1997 |
| CN | 1444269 | A | 9/2003 |
| JP | 10154767 | A * | 6/1998 |
| JP | 11-220050 | | 8/1999 |
| JP | 11220050 | | 8/1999 |
| JP | 2003-264253 | | 9/2003 |
| JP | 2004-128288 | A | 4/2004 |

\* cited by examiner

*Primary Examiner*—Leonardo Andújar
(74) *Attorney, Agent, or Firm*—Foley & Lardner LLP

(57) ABSTRACT

A technology providing an improvement in the durability in the condition of changing the temperature, while ensuring characteristics such as the applicability to applications utilizing larger electric current, lower resistance and the like can be achieved. A semiconductor device 100 includes a ceramic multiple-layered interconnect substrate 120, a silicon chip 110 that is flip-bonded to a chip-carrying region of the ceramic multiple-layered interconnect substrate 120, and an external connecting bumps 161 and an external connecting bumps 163, which are provided in the side that the silicon chip 110 of the ceramic multiple-layered interconnect substrate 120 is carried. The silicon chip 110 includes a front surface electrode and a back surface electrode. The ceramic multiple-layered interconnect substrate 120 includes an interconnect layer composed of a conductive material, and the interconnect layer composes a multiple-layered interconnect layer provided on a front surface and in an interior of the ceramic multiple-layered interconnect substrate 120. The front surface electrode of the silicon chip is electrically connected to the external connecting bump 161 and the external connecting bump 163 through the multiple-layered interconnects in the multiple-layered interconnect layer.

20 Claims, 9 Drawing Sheets

SEMICONDUCTOR DEVICE

This application is based on Japanese patent application No. 2005-23,049, the content of which is incorporated hereinto by reference.

BACKGROUND

1. Technical Field

The present invention relates to a semiconductor device having a semiconductor chip bonded to a printed circuit board.

2. Related Art

Compatibility to applications utilizing larger electric current, lower resistance and an improved heat release characteristics are required for semiconductor elements employed in electrical power applications. Since vertical metal oxide semiconductor (MOS) transistors or diodes among such semiconductor elements, for example, have configurations including electrodes on a front surface and a back surface of the semiconductor chip, it is necessary to respectively connect a front surface electrode and a back surface electrode to conductive materials of the mounting substrate, when it is to be mounted. Such type of technologies includes a technology described in U.S. Pat. No. 6,133,634 to Joshi.

U.S. Pat. No. 6,133,634 describes a semiconductor device including a silicon die carried inside a cavity of a carrier made of a metal such as copper (Cu). Since the back surface of the silicon die is opposed to the carrier in this device, the silicon die is to be flip chip-bonded to a printed circuit board in a face-down orientation.

However, further investigation on the technology described in U.S. Pat. No. 6,133,634 conducted by the present inventors clarified that there is a room for improving the durability thereof in the situation of changing the temperature. More specifically, a multiple-layered structure of thin films is provided on an element formation surface of the semiconductor chip that is flip chip-bonded to the printed circuit board, and the two-dimensional structure thereof is also miniaturized. However, relatively larger temperature variation is repeatedly occurred in the device including a power element, when the power element is switched or when the environmental temperature is changed after mounting the semiconductor chip. Therefore, there is a concern that a deterioration due to a temperature variation may be occurred in a region having a fine structure in the element formation surface and more specifically in the front surface electrode or the vicinity thereof.

SUMMARY OF THE INVENTION

The present inventors consider that the factor for deteriorating the durability during the temperature variation stated above is due to a difference in the thermal expansion coefficients between the semiconductor (silicon) chip and the printed circuit board. Since the linear expansion coefficient of the printed circuit board is larger than the linear expansion coefficient of the semiconductor chip, the semiconductor chip cannot suitably follow the thermal expansion or the thermal shrinkage of the printed circuit board in the case of the temperature variation after the mounting. Since the stress concentrates in a region of the semiconductor chip in vicinity of the front surface electrode where a connection to the printed circuit board is made, a degradation is easily occurred in the region in vicinity of the front surface electrode. Consequently, the present inventors have eagerly made efforts for providing an improvement in the durability in the condition of changing the temperature, while ensuring characteristics such as the applicability to applications utilizing larger electric current, lower resistance and the like, which are required for the semiconductor devices employed for power applications, eventually leading to the present invention.

According to one aspect of the present invention, there is provided a semiconductor device, comprising: an insulating substrate; a semiconductor chip flip-bonded to a chip-carrying region of the insulating substrate; and an external mounting terminal provided in a side of the insulating substrate, on which the semiconductor chip is carried, wherein the semiconductor chip includes a front surface electrode provided on an element formation surface of the semiconductor chip and a back surface electrode provided on a back surface of the semiconductor chip, wherein the insulating substrate includes an interconnect layer composed of a conductive material, wherein the interconnect layer composes a multiple-layered interconnect layer provided on a front surface and in an interior of the insulating substrate, and wherein the front surface electrode of the semiconductor chip is electrically connected to the external mounting terminal through the multiple-layered interconnects in the multiple-layered interconnect layer.

The semiconductor device according to the above-described aspect of the present invention is configured to provide the front surface electrode of the semiconductor chip so as to be opposed to the insulating substrate and the semiconductor chip is flip-bonded to the insulating substrate. Further, the insulating substrate has the multiple-layered interconnects, and the surface electrode is electrically connected to the external mounting terminal through the multiple-layered interconnects in the multiple-layered interconnect layer. Consequently, a conduction path having a lower resistance passing through the multiple-layered interconnects can be ensured, even if a configuration that the element formation surface of the semiconductor chip is opposed to the insulating substrate, instead of being opposed to the printed circuit board, is employed. Further, sufficiently larger electric current can be supplied to the front surface electrode from the external mounting terminal.

In addition, since the front surface electrode of the semiconductor chip is disposed to be opposed to the chip-carrying region of the insulating substrate according to the above-described aspect of the present invention, the semiconductor chip is to be disposed on the printed circuit board in a position of being faced-up, while maintaining the condition that the back surface electrode is opposed to the printed circuit board. The difference in the linear expansion coefficient between the substrate of the semiconductor chip and the printed circuit board can be reduced by disposing the front surface electrode of the semiconductor chip so as to be opposed to the insulating substrate. Consequently, the stress concentration to the front surface electrode or the vicinity thereof can be inhibited, thereby providing an improved heat resistance in the condition of changing the temperature. Further, since a heat in the side of the front surface of the semiconductor chip is released to the outside of the chip from a conduction path along the above-described multiple-layered interconnect layer, the configuration providing an improved heat release characteristics can be obtained.

As such, the semiconductor according to the present invention is configured to ensure characteristics such as the applicability to applications utilizing larger electric current, lower resistance and the like with a simple configuration, as well as providing an improved heat release characteristics.

The semiconductor device according to the above aspect of the present invention may further have a configuration, in which an electroconductive through plug that provides a connection between a plurality of interconnects is provided on the insulating substrate. Having such configuration, heat release characteristics in the side of the element formation surface of the semiconductor chip can be further improved. The semiconductor device according to the above aspect of the present invention may further have a configuration, in which the through plug is provided right above the front surface electrode. This can provide a structure having the electric conductor of the insulating substrate, which is broadened from the right overhead of the front surface electrode of the semiconductor chip toward the circumference thereof, thereby providing a structural member that is an apparent radiation fin right above the front surface electrode. Consequently, further improved heat release characteristics in the side of the element formation surface of the semiconductor chip can be presented by the fin efficiency of the electric conductor in the insulating substrate.

According to the present invention, a technology providing an improvement in the durability in the condition of changing the temperature, while ensuring characteristics such as the applicability to applications utilizing larger electric current, lower resistance and the like can be achieved, by providing the flip-bonding of the semiconductor chip to the insulating substrate having the multiple-layered interconnect layer, providing the external mounting terminal in the side of the insulating substrate, on which the semiconductor chip is carried, and providing the electrical connection between the surface electrode of the semiconductor chip and the external mounting terminal through the multiple-layered interconnects provided in the insulating substrate.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described below in reference to annexed figures, with regard to cases of semiconductor devices comprising chips, which have a transistor having a type of a structure of an electric conduction path that passes the electric current along a direction normal to the silicon substrate (hereinafter in this specification, such transistor is referred to as a vertical transistor). In all figures, an identical numeral is assigned to an element commonly appeared in the figures, and the detailed description thereof will not be presented.

First Embodiment

Figure 1:
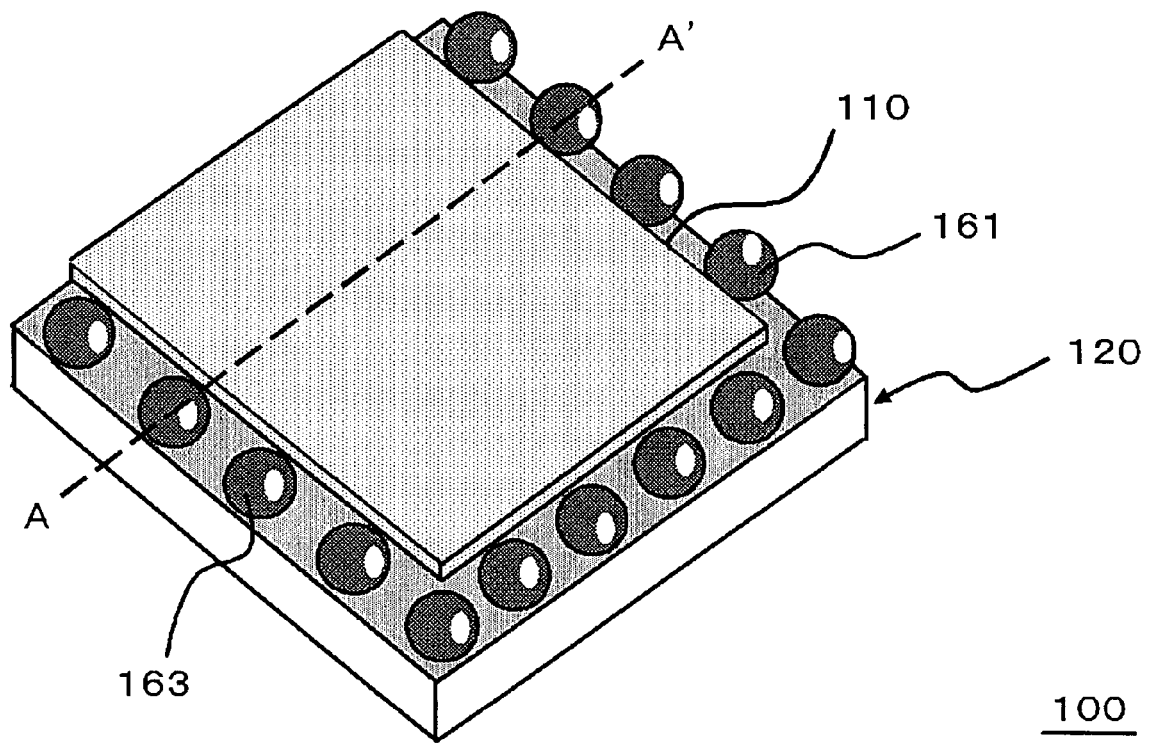
FIG. 1 is a perspective view, illustrating a configuration of a semiconductor device in an embodiment according to the present invention.
Figure 2A:
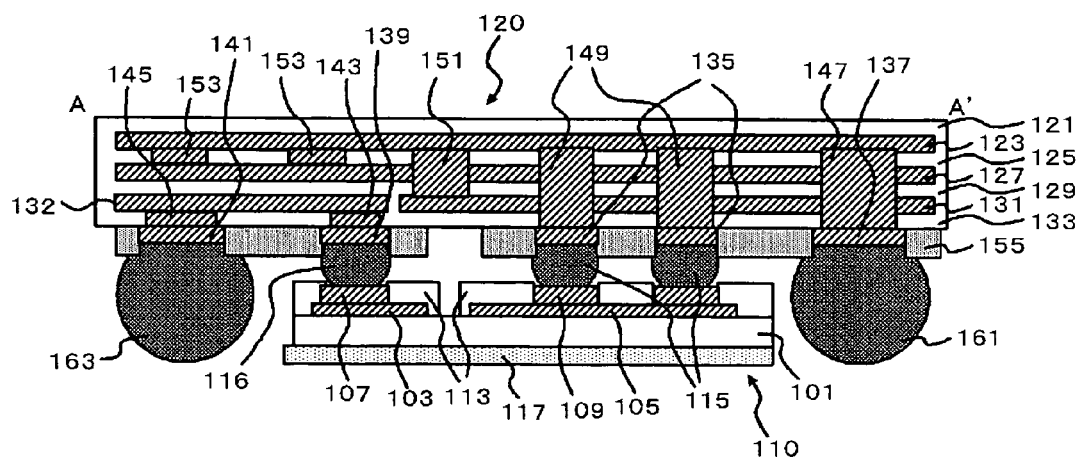
FIGS. 2A and 2B are cross-sectional views of the semiconductor device shown in FIG. 1 along line A-A'.

FIG. 1 is a perspective view, showing a configuration of a semiconductor device according to the present embodiment. FIG. 2A is a cross-sectional view of the semiconductor device along line A-A' shown in FIG. 1. It should be noted that FIG. 2A shows the semiconductor device shown in FIG. 1 in a condition of being flipped.

The semiconductor device 100 shown in FIG. 1 and FIG. 2A includes an insulating substrate (ceramic multiple-layered interconnect substrate 120), a semiconductor chip (silicon chip 110) that is flip-bonded to a chip-carrying region of the ceramic multiple-layered interconnect substrate 120, and external mounting terminals (external connecting bumps 161), which are provided in the side that the silicon chip 110 of the ceramic multiple-layered interconnect substrate 120 is carried.

The silicon chip 110 includes front surface electrodes (second front surface electrodes 109) that are provided in the element formation surface of the silicon chip 110 and a back surface electrode 117 provided on the back surface thereof.

The ceramic multiple-layered interconnect substrate 120 includes a layer of interconnects (first interconnect 123 and the like) composed of a conductive material, and the interconnect layer includes a layer of multiple-layered interconnects (first interconnect 123, second interconnect 127, third interconnect 131, third interconnect 132, fourth interconnect 135, fourth interconnect 137, fourth interconnect 139, fourth interconnect 141) provided on the front surface and in the interior of the ceramic multiple-layered interconnect substrate 120.

The second front surface electrode 109 of the silicon chip 110 is electrically connected to an external connecting bump 161, through the multiple-layered interconnect layer composed of different layers that are mutually electrically connected.

A linear expansion coefficient of the ceramic multiple-layered interconnect substrate 120 is equal to or more than 3 ppm/degree C. and equal to or less than 10 ppm/degree C.

The semiconductor device 100 also includes a plurality of front surface electrodes (first front surface electrode 107 and second front surface electrode 109), and a plurality of external mounting terminals (external connecting bump 161 and external connecting bump 163). Focusing on the ceramic multiple-layered interconnect substrate 120, the interconnect layer composes a plurality of conduction paths, and the first front surface electrode 107 and the second front surface electrode 109 is electrically connected to different external mounting terminals and more specifically electrically connected to the external connecting bump 163 and the external connecting bump 161, respectively, through different conduction paths.

The first front surface electrode 107 of the silicon chip 110 is electrically connected to the external connecting bump 163 through an interconnect in the multiple-layered interconnect layer. This path is not necessary to pass through a plurality of interconnect layers, unlike as the above-described interconnect path connecting the second front surface electrode 109 to the external connecting bump 161, is sufficient to pass through at least an interconnect provided in the ceramic multiple-layered interconnect substrate 120.

In addition, the ceramic multiple-layered interconnect substrate 120 is provided with electroconductive through plugs (connecting plug 149 and the like) that provides connections among the multiple-layered interconnects. The through plug of connecting plug 149 and the like are provided right above the first front surface electrode 107 or the second front surface electrode 109.

Here, in this specification, the through plugs (connecting plug 149 and the like) are not limited to a configuration composed of a single conductive member, and may be a configuration having a plurality of conductive members that forms a layered structure. For example, a structure having a multilayered structure of a plurality of interconnects and plugs that provides connections between a plurality adjacent interconnects may be employed. This structure may occupy a columnar region, or more specifically a cylindrical region. Further, a plurality of through plugs may be further arranged in addition to the regions right above the front surface electrode or the bump.

The external connecting bump 161 and the external connecting bump 163 are electroconductive bumps provided lateral to the silicon chip 110.

The first front surface electrode 107 and the second front surface electrode 109 are bump-bonded to the interconnects in the interconnect layer (fourth interconnect 139 and fourth interconnect 135), the silicon chip 110 is flip-bonded to the ceramic multiple-layered interconnect substrate 120, and the external connecting bump 163 and the external connecting bump 161 are the larger bumps than the bumps (bump 115, bump 116) that provide connecting the first front surface electrode 107 and the second front surface electrode 109 with the fourth interconnect 139 and the fourth interconnect 135.

The silicon chip 110 includes a vertical MOS transistor. The second front surface electrode 109 and the first front surface electrode 107, which are electrically connected through the multiple-layered interconnects in the multiple-layered interconnect layer to the external connecting bump 161 and the external connecting bump 163, respectively, are the source electrode and the gate electrode of the vertical MOS transistor, respectively. Further, the back surface electrode 117 is the drain electrode of the vertical MOS transistor.

Figure 2B:
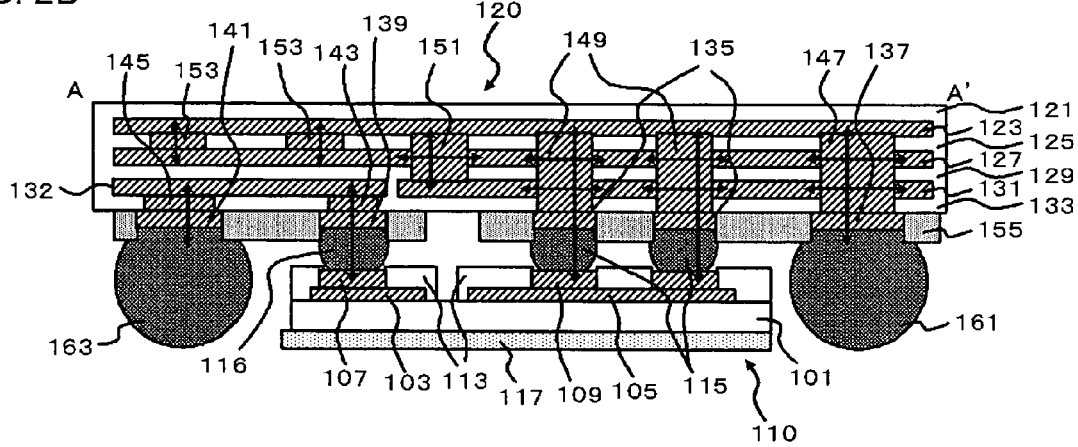
Figure 3:
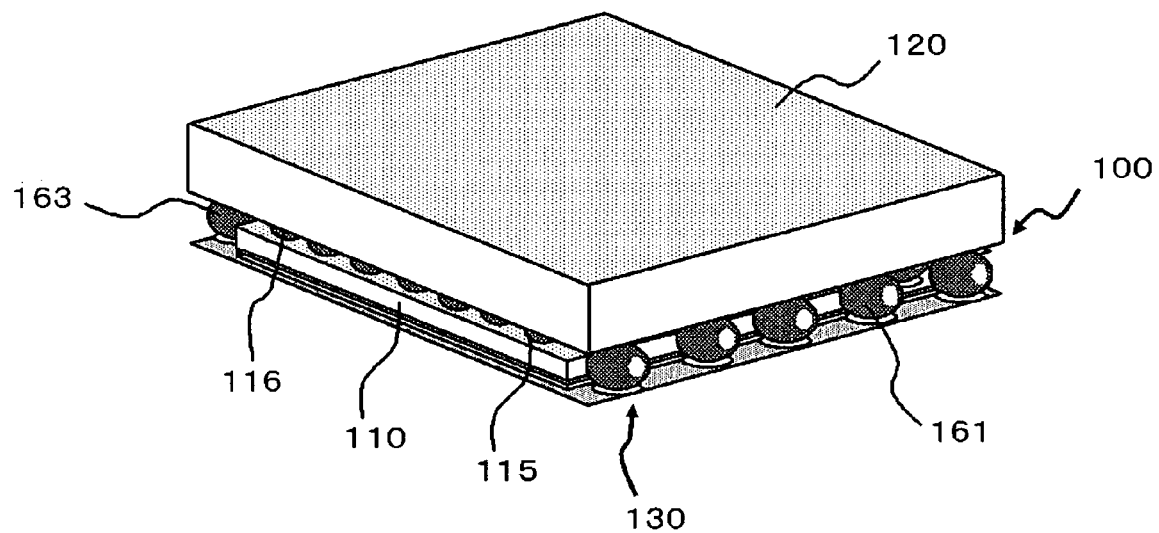
FIG. 3 a perspective view, illustrating a configuration of the semiconductor device in the embodiment according to the present invention.

FIG. 3 is a perspective view of the semiconductor device 100 shown in FIG. 1 and FIG. 2A, showing a condition being carried on the printed circuit board. In the semiconductor device shown in FIG. 3, it is configured that the silicon chip 110 is provided on the printed circuit board 130, the external connecting bumps 161, the external connecting bumps 163 and the back surface electrode 117 (also see FIG. 2A) are electrically connected to the printed circuit board 130, and both of the silicon chip 110 and the printed circuit board 130 are disposed in the side being opposite to the ceramic multiple-layered interconnect substrate 120. Since the silicon chip 110 is connected onto the ceramic multiple-layered interconnect substrate 120 with a facing-down condition and further the ceramic multiple-layered interconnect substrate 120 is connected onto the printed circuit board 130 with a face-down condition, silicon chip 110 is connected onto the printed circuit board 130 with a face-up condition. The printed circuit board 130 is provided with a predetermined interconnect structure (not shown). The configuration of the semiconductor device 100 according to the present embodiment will be further described in detail in reference to FIG. 1 to FIG. 3.

The planar geometries of the silicon chip 110 and the ceramic multiple-layered interconnect substrate 120 are rectangular. From the upper viewpoint, the ceramic multiple-layered interconnect substrate 120 has larger area than the silicon chip 110, and is disposed to cover the element formation surface of the silicon chip 110. The chip-carrying region of the ceramic multiple-layered interconnect substrate 120 is provided over a portion of the circumference of the ceramic multiple-layered interconnect substrate 120, and the external connecting bump 161 and the external connecting bump 163 are disposed in regions other than the above-described portion of the circumference thereof, so as to surround the circumference of the silicon chip 110. More specifically, one side of the silicon chip 110 is disposed in a position which is slightly retreated from one side of the ceramic multiple-layered interconnect substrate 120, and in other three sides of the silicon chip 110, the ceramic multiple-layered interconnect substrate 120 extends from the circumference of the silicon chip 110. This can provide preventing the damage to the silicon chip 110, when the ceramic multiple-layered interconnect substrate 120 is diced to be divided in the process for manufacturing the semiconductor device 100. Further, a level of the retreating of one side of the silicon chip 110 may be a level, such that the retreating provides a certain space that would prevent a damage during the dicing process. Further, the external mounting terminals are arranged on the ceramic multiple-layered interconnect substrate 120 along the circumference of the protruding side, so as to surround the periphery of the silicon chip 110. The external mounting terminals are constituted by the external connecting bumps 161 and the external connecting bumps 163 as discussed later.

The ceramic multiple-layered interconnect substrate 120 is connected to the printed circuit board 130 via the external connecting bump 161 and the external connecting bump 163. The external connecting bump 161 and the external connecting bump 163 are larger than the bump 115 and the bump 116, and have a height, which is slightly higher than a height approximately equivalent to a combined height of the bump 116 or the bump 115 and the silicon substrate 101 in a direction normal to the silicon substrate 101. Having such configuration, the manufacturing stability can be further improved. The heights of the external connecting bump 161 and the external connecting bump 163 may be suitably selected to ensure sufficient connecting reliability for providing the connection of the silicon chip 110 to the ceramic multiple-layered interconnect substrate 120. The semiconductor device 100 is configured to have the silicon chip 110 and the bump 115 and the bump 116 arranged between the printed circuit board 130 and the ceramic multiple-layered interconnect substrate 120.

The silicon chip 110 includes the silicon substrate 101 and the vertical MOS transistor (not shown). The first pad 103 and the second pad 105 are provided in the same layer in the element formation surface of the silicon substrate 101. Materials available for the first pad 103 and the second pad 105 may be metals such as, for example, Al, Cu, Ni, Au, Ag and the like. The first pad 103 and the second pad 105 are covered by a passivation film 113. The passivation film 113 may be, for example, composed of an organic resin film such as polyimide. The passivation film 113 is provided with an opening, through which the first pad 103 and the second pad 105 are exposed, and the upper surfaces of the first pad 103 and the second pad 105 are in contact with the first front surface electrode 107 and the second front surface electrode 109 in the opening, respectively.

The first front surface electrode 107 and the second front surface electrode 109 are connected to the bump 116 and the bump 115, respectively. Further, the first front surface electrode 107 and the second front surface electrode 109 are connected to a gate electrode (not shown) and a source electrode (not shown) of the vertical MOS transistor. Further, the back surface electrode 117 is presented on the entire back surface of the silicon substrate 101. The back surface electrode 117 functions as a drain electrode of the vertical MOS transistor.

The ceramic multiple-layered interconnect substrate 120 includes a multiple-layered of a first insulating layer 121, a second insulating layer 125, a third insulating layer 129 and a fourth insulating layer 133, which are sequentially layered in this order. These insulating layers may be composed of, for example, alumina ($Al_2O_3$). An interconnect layer formed to have a predetermined pattern is provided between the respective insulating layers. More specifically, the first interconnect 123; the second interconnect 127; the third interconnect 131 and the third interconnect 132; and the fourth interconnect 135, the fourth interconnect 137, the fourth interconnect 139 and the fourth interconnect 141 are provided between the first insulating layer 121 and the second insulating layer 125; between the second insulating layer 125 and the third insulating layer 129; between the third insulating layer 129 and the fourth insulating layer 133; and on the fourth insulating layer 133, respectively. The third interconnect 131 and the third interconnect 132 are provided in the same layer. Similarly, the fourth interconnect 135, the fourth interconnect 137, the fourth interconnect 139 and the fourth interconnect 141 are provided in the same layer.

Side surfaces of the fourth interconnect 135, the fourth interconnect 137, the fourth interconnect 139, and the fourth interconnect 141 are coated with protective films 155. Openings, through which the surfaces of the respective fourth interconnects are exposed, are provided in the protective film 155. The protective film 155 may be composed of, for example, a solder resist film. The fourth interconnect 135, the fourth interconnect 137, the fourth interconnect 139 and the fourth interconnect 141 are in contact with the bump 115, the external connecting bump 161, the bump 116 and the external connecting bump 163, respectively, in the respective openings of the protective film 155.

Further, the connecting plug 153, the connecting plug 151, the connecting plug 149, the connecting plug 147, the connecting plug 145 and the connecting plug 143, which are electroconductive through plugs providing the connections between interconnect intervals, are provided in the ceramic multiple-layered interconnect substrate 120. These connecting plugs are cylindrical structural members composed of a layered member of a plurality of interconnects and through plugs 173 (shown in FIG. 4B) that connect a plurality of adjacent interconnects.

The connecting plug 153 extends through the second insulating layer 125, and connects the second interconnect 127 with the first interconnect 123. The connecting plug 151 extends through the second insulating layer 125 and the third insulating layer 129, and linearly connects the first interconnect 123, the second interconnect 127 and the third interconnect 131 along a direction normal to the ceramic multiple-layered interconnect substrate 120. Further, the connecting plug 149 and the connecting plug 147 extends through the second insulating layer 125, the third insulating layer 129 and the fourth insulating layer 133. The connecting plug 149 linearly connects the first interconnect 123, the second interconnect 127, the third interconnect 131 and the fourth interconnect 135 along a direction normal to the ceramic multiple-layered interconnect substrate 120. The connecting plug 147 linearly connects the first interconnect 123, the second interconnect 127, the third interconnect 131 and the fourth interconnect 137 along a direction normal to the ceramic multiple-layered interconnect substrate 120. The connecting plug 145 and the connecting plug 143 extend through the fourth insulating layer 133. The connecting plug 145 connects the third interconnect 132 and the fourth interconnect 141, and the connecting plug 143 connects the third interconnect 132 and fourth interconnect 139.

The semiconductor device 100 includes the above-mentioned configuration. Further, as conduction paths starting from the front surface electrode of the silicon substrate 101 through the multiple-layered interconnects in the ceramic multiple-layered interconnect substrate 120 and reaching to the front surface side of the printed circuit board 130, a plurality of paths described below are provided.

(I): a path starting from the external connecting bump 163, through the fourth interconnect 141, the connecting plug 145, the third interconnect 132, the connecting plug 143, the fourth interconnect 139 and the bump 116, reaching to the first front surface electrode 107 of the silicon chip 110; and (II): a path starting from the external connecting bump 161, through at least one of the fourth interconnect 137, the third interconnect 131, the second interconnect 127 and the first interconnect 123, and through the fourth interconnect 135 and the bump 115, reaching to the second front surface electrode 109.

These conduction paths are paths through the multiple-layered interconnects of the ceramic multiple-layered interconnect substrate 120, and are typically represented by paths shown by arrows in FIG. 2B, for example. FIG. 2B is a cross-sectional view, indicating conduction paths in the configuration of FIG. 2A.

In addition, the above-described path (II) is a path composed of a plurality of conduction paths of different levels (layers) mutually connected in parallel and provided with interconnects conducting therethrough.

Next, a process for manufacturing the semiconductor device 100 shown in FIG. 1 and FIG. 2A will be described. Semiconductor device 100 is obtained by preparing the silicon chip 110 and the ceramic multiple-layered interconnect substrate 120, disposing the silicon chip 110 in a predetermined region (chip-carrying region) of a surface of the ceramic multiple-layered interconnect substrate 120 opposed to the silicon chip 110, and disposing the external connecting bumps 161 and the external connecting bumps 163 in the periphery of the chip-carrying region. FIG. 4A to FIG. 4C and FIG. 5A to FIG. 5C are cross-sectional views, showing the process for manufacturing the semiconductor device 100.

Silicon chip 110 is obtained by forming a predetermined devices including the vertical MOS transistor in the silicon substrate 101 by a known method.

Figure 4A:
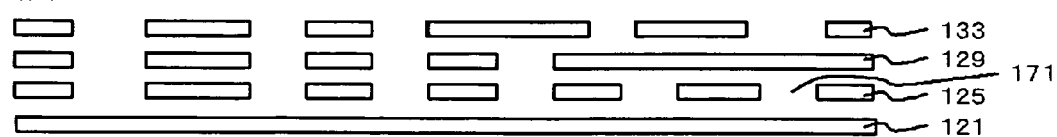
FIGS. 4A, 4B and 4C are cross-sectional views, illustrating a process for manufacturing the semiconductor device shown in FIG. 1.

In manufacturing the ceramic multiple-layered interconnect substrate 120, first of all, as shown in FIG. 4A, a sheet-shaped alumina is prepared for the respective insulating layers of the first insulating layer 121, the second insulating layer 125, the third insulating layer 129 and the fourth insulating layer 133. In this case, the thickness of each of the insulating layers may be, for example, 25 µm or more and 500 µm or less. Having the thickness of equal to or thicker than 25 μm can ensure providing insulations between the interconnects of different layers. On the other hand, having the thickness of equal to or thinner than 500 μm can suitably reduce the thickness of the ceramic multiple-layered interconnect substrate, while ensuring required characteristics thereof. Then, through holes 171 are formed in a predetermined position of these sheets. Suitable method for forming the through holes 171 may be, for example, etching, drilling, laser beam processing, punching and the like.

Figure 4B:
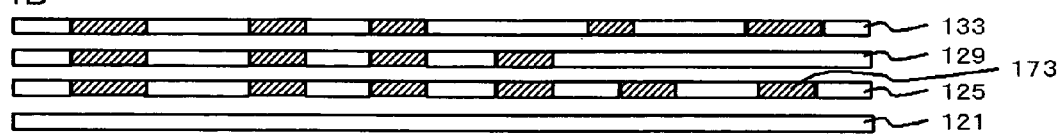
Figure 4C:
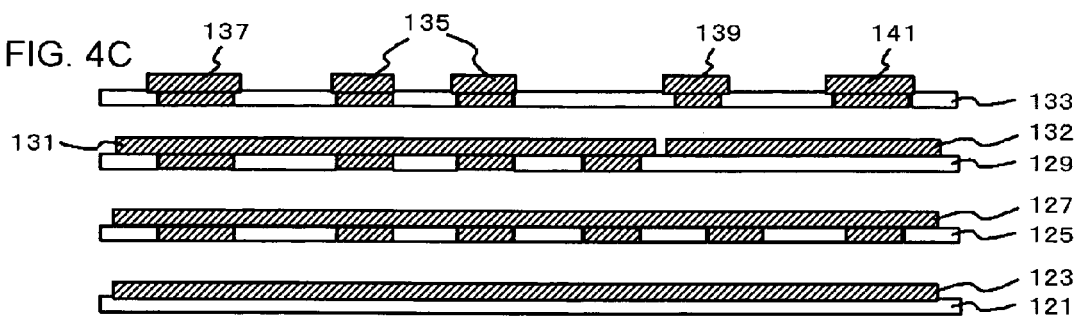

Next, the through holes 171 are filled with a metal or an electroconductive paste containing a metal for respective sheets to form through plugs 173 (FIG. 4B). Subsequently, interconnects having predetermined patterns, or more specifically, the first interconnect 123; the second interconnect 127; the third interconnect 131; and the third interconnect 132 and the fourth interconnect 135 to the fourth interconnect 141 are formed on the surfaces of the first insulating layer 121, the second insulating layer 125, the third insulating layer 129 and the fourth insulating layer 133, respectively. The interconnect layer is formed by, for example, screen-printing an electroconductive paste containing a metal on the sheet (FIG. 4C). Alternative to the process utilizing the screen-printing, a process for depositing a metal on the sheet or the process for printing a metallic film thereon may also be employed. Here, the thickness of the interconnects may be, for example, 0.5 μm or more and 50 μm or less.

Figure 5A:
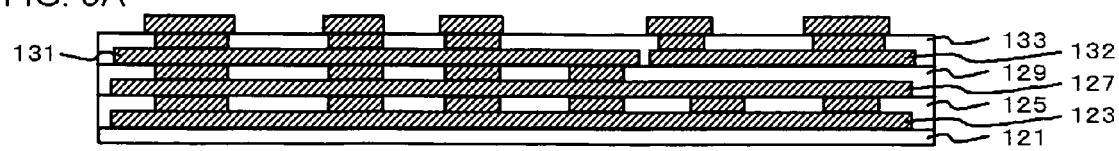
FIGS. 5A, 5B and 5C are cross-sectional views, illustrating a process for manufacturing the semiconductor device shown in FIG. 1.

Then, the sheets, each having an interconnect layer on the upper surface thereof, and corresponding to the first insulating layer 121, the second insulating layer 125, the third insulating layer 129 and the fourth insulating layer 133, are layered in this order from the bottom, and then compressively bonded to obtain a multi-layered member. The obtained multi-layered member is baked at a predetermined temperature for a predetermined time (FIG. 5A). The above-described process provides forming the connecting plug 147, the connecting plug 149 and the connecting plug 151, which elongate over a plurality of insulating layers. In addition, the first interconnect 123 and the second interconnect 127 are connected via the connecting plug 153. Further, third interconnect 132 is connected to the fourth interconnect 139 and the fourth interconnect 141 via the connecting plug 143 and the connecting plug 145, respectively.

Figure 5B:
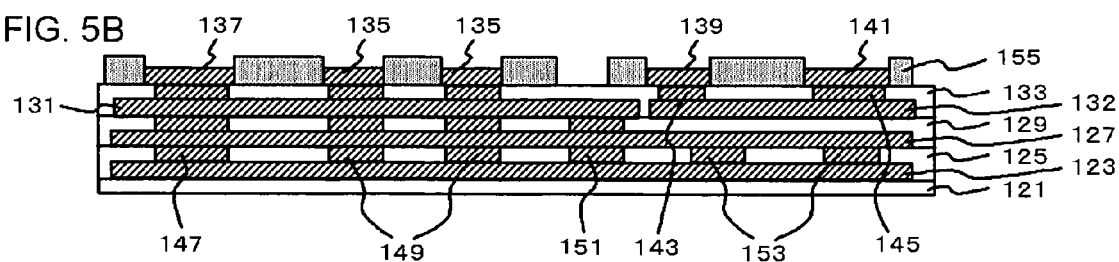

Subsequently, protective films 155 are formed on the surface of the fourth insulating layer 133 to provide coating the fourth interconnect 135 to the fourth interconnect 141. The protective film 155 may be composed of a solder resist film or the like. Then, through holes extending through the protective film 155 are formed in predetermined locations corresponding to regions for forming the fourth interconnect 135 to the fourth interconnect 141 to expose at least a portion of the upper surfaces of the fourth interconnect 135 to the fourth interconnect 141 (FIG. 5B).

Figure 5C:
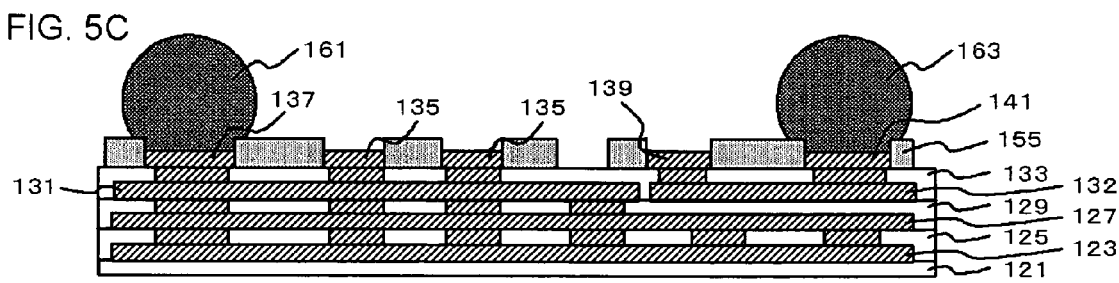

Further, the external connecting bump 161 and external connecting bump 163 are formed on the fourth interconnect 137 and the fourth interconnect 141, respectively, so as to fill the openings. The external connecting bump 161 and the external connecting bump 163 are designed to be bumps that are larger than the bump 115 and the bump 116 previously provided on the semiconductor chip 110 (FIG. 5C). Having such configuration, connection between the printed circuit board 130 and the interconnects within the ceramic multiple-layered interconnect substrate 120 can be achieved With higher efficiency. The external connecting bump 161 and the external connecting bump 163 may be composed of solder having a diameter, for example, 100 μm or more and 800 μm or less. Having the thickness of equal to or larger than 100 μm can further ensure connecting the ceramic multiple-layered interconnect substrate 120 to the silicon chip 110. On the other hand, having the thickness of equal to or smaller than 800 μm can further ensure stably connecting the ceramic multiple-layered interconnect substrate 120 to the silicon chip. As described above, the ceramic multiple-layered interconnect substrate 120 including the external connecting bump 161 and the external connecting bump 163 fixed on the connecting surface of the silicon chip 110 is obtained.

Then, the silicon chip 110 is bonded onto a predetermined location on the obtained ceramic multiple-layered interconnect substrate 120 in a face-down orientation. The silicon chip 110 is electrically connected to the interconnect layer in ceramic multiple-layered interconnect substrate 120 via the bump 115 or the bump 116 previously provided on the silicon chip 110. Then, the ceramic multiple-layered interconnect substrate 120 is divided into pieces by a processing such as dicing, breaking and the like to obtain the semiconductor device 100.

Further, the back surface electrode 117 of the silicon chip 110, the external connecting bump 161 and the external connecting bump 163 are joined to respective predetermined interconnects on the printed circuit board 130 to mount the semiconductor device 100 onto the printed circuit board 130. In this case, portions in the interconnects provided on the printed circuit board 130 connected to the external connecting bump 161 or the external connecting bump 163 may be designed to be regions having areas that are sufficiently smaller than the cross sections of the external connecting bump 161 or the external connecting bump 163, so that unwanted spreading of the external connecting bump 161 and the external connecting bump 163 over the printed circuit board 130 can be inhibited by utilizing the surface tension. This will be described below in reference to FIG. 6A and FIG. 6B.

Figure 6A:
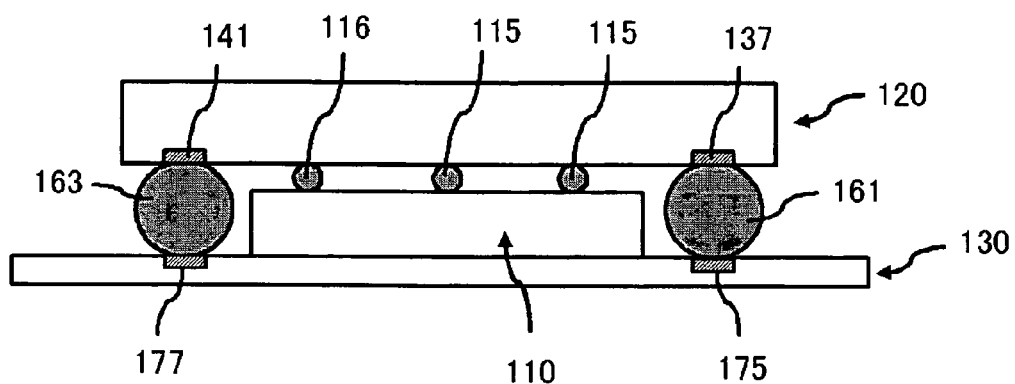
FIGS. 6A and 6B are cross-sectional views, illustrating configurations of the semiconductor devices in the embodiment according to the present invention.

FIG. 6A is a cross-sectional view of the semiconductor device 100, presented by simplifying the cross sectional structure (FIG. 2A) of the semiconductor device 100 and illustrated thereof with the structure of the printed circuit board 130. The printed circuit board 130 is provided with the external interconnect 175 and the external interconnect 177. The external interconnect 175 and the external interconnect 177 are interconnects that are connected to the external connecting bump 161 and the external connecting bump 163, respectively. In FIG. 6A, the external interconnect 175 and the external interconnect 177 may be designed to be regions having areas that are sufficiently smaller than the cross sections of maximum region of the cross section of the external connecting bump 161 or the external connecting bump 163, so that unwanted spreading of the materials composing the external connecting bump 161 and the external connecting bump 163 over wider range on the printed circuit board 130 can be inhibited, thereby allowing ensured connections in the predetermined regions. Further, the dimensions of the external interconnect 175 and the external interconnect 177 may be designed to be substantially equivalent to the dimensions of the fourth interconnect 137 and the fourth interconnect 141, so that the structural symmetry of the connecting regions can be enhanced, thereby further reducing the stress.

Figure 6B:
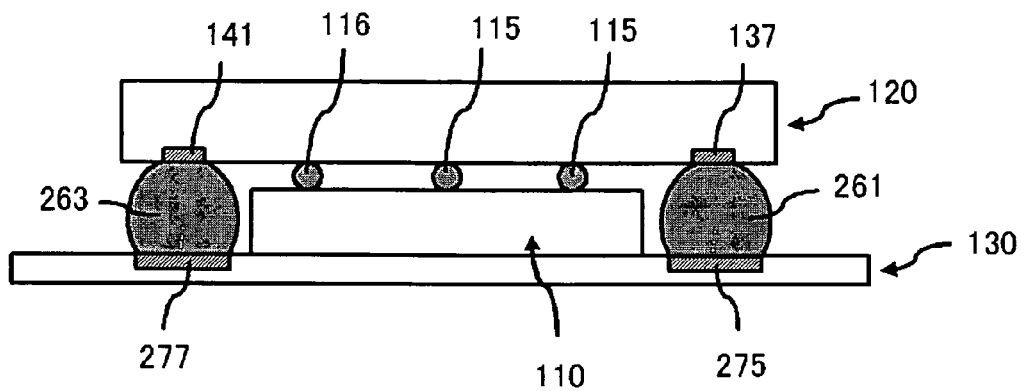

On the other hand, FIG. 6B illustrates a semiconductor device having a structure shown in FIG. 6A, except that the external interconnect 275 and the external interconnect 277 in FIG. 6A are replaced with the external interconnect 175 and the external interconnect 177. Since areas of the regions for forming the external interconnect 275 and the external interconnect 277 are larger than the regions for forming the external interconnect 175 and the external interconnect 177, respectively, the external connecting bump 261 and the external connecting bump 263 corresponded to the external connecting bump 161 and the external connecting bump 163, respectively, are spread over the printed circuit board 130. Consequently, as shown in FIG. 6A, the regions for forming the external interconnect 175 and the external interconnect 177 may have dimensions which are substantially equivalent to the dimensions of the fourth interconnect 137 and the fourth interconnect 141.

In addition, materials of the bump 115, the bump 116, the external connecting bump 161 and the external connecting bump 163 may be, for example, lead-free solder. Further, high-temperature solder that exhibits higher melting point than lead-free solder, or metal bumps (Au, Cu, Ni), may be selected for the material of the bump 115 and the bump 116, and lead-free solder may be selected for the material of the external connecting bump 161 and the external connecting bump 163. This can surely avoid melting the bump 115 and the bump 116 during a heat treatment process for providing a connection of the external connecting bump 161 and the external connecting bump 163 to the printed circuit board 130. Consequently, the ceramic multiple-layered interconnect substrate 120 can be more stably bonded and connected to the silicon chip 110.

Next, advantageous effects obtainable by having the configurations of the semiconductor device 100 illustrated in FIG. 1 and FIG. 2A will be described.

In the semiconductor device 100, the front surface electrode-formation surface, or namely the element formation surface, of the silicon chip 110 is faced or opposed to the ceramic multiple-layered interconnect substrate 120. The thermal expansion coefficient of the ceramic is closer to the thermal expansion coefficient of the silicon substrate 101. Consequently, the stress concentration to the portion for connecting the silicon chip 110 with the ceramic multiple-layered interconnect substrate 120, or more specifically, the stress concentration to the first front surface electrode 107 and the second front surface electrode 109, due to a difference in the thermal expansion coefficient between the silicon substrate 101 and the printed circuit board 130 when a thermal history is given to the semiconductor device 100, can be inhibited. Thus, an improved endurance against the heating of the front surface electrode provided on the element formation surface of the silicon substrate 101 or the vicinity thereof can be presented.

Further, in the semiconductor device 100, the printed circuit board 130 is connected to the ceramic multiple-layered interconnect substrate 120 via the external connecting bump 161 and the external connecting bump 163. In addition, the level of miniaturization for the multiple-layered structure of the ceramic multiple-layered interconnect substrate 120 is lower than the multiple-layered structure in the surface of the silicon substrate 101, and from the upper viewpoint, areas of the fourth interconnect 137 and the fourth interconnect 141 are larger than the fourth interconnect 135 and the fourth interconnect 139. Consequently, the fourth interconnect 137, the fourth interconnect 141 and regions in vicinity thereof in the ceramic multiple-layered interconnect substrate 120 is configured to exhibit relatively improved endurances against the stress concentration. Although the difference in the thermal expansion coefficient between the ceramic multiple-layered interconnect substrate 120 and the printed circuit board 130 are larger than the difference in the thermal expansion coefficient between the silicon chip 110 and the ceramic multiple-layered interconnect substrate 120, deteriorations of the regions in vicinity of the fourth interconnect 137 and the fourth interconnect 141 due to the thermal history after being connected to the printed circuit board 130 can be inhibited by providing a sufficiently increased endurance of these connected regions against the stress concentration.

As such, an improved resistance of the whole device to the temperature variation can be provided for the semiconductor device 100, by disposing the surface having finer surface structure and relatively lower endurance against the temperature variation, like the element formation surface of the silicon substrate 101 to be opposed to the substrate having lower differential linear expansion coefficient, and by providing the configuration that exhibits relatively better endurance against the temperature variation for the configuration of the connecting region between the members having relatively large difference in the linear expansion coefficient.

In addition, in the semiconductor device 100, the printed circuit board 130 is connected to the ceramic multiple-layered interconnect substrate 120 via the external connecting bump 161 and the external connecting bump 163 composed of solder. Consequently, a process for melting solder can be employed for providing the bonding. Thus, the external connecting bump 161 and the external connecting bump 163 can be deformed along a direction normal to the silicon substrate 101 in accordance with a height from the back surface of the silicon chip 110 (lower surface in FIG. 2A) to the front surface of the ceramic multiple-layered interconnect substrate 120 (lower surface in FIG. 2A). Accordingly, the semiconductor device 100 has the configuration having larger allowance in height direction for mounting thereof onto the printed circuit board 130, as compared with the semiconductor device according to second embodiment discussed later. Consequently, the semiconductor device 100 has the configuration that promotes further stable mounting to the printed circuit board 130, as compared with the configuration of the device in second embodiment discussed later.

In addition, the multiple-layered interconnects are formed in the ceramic multiple-layered interconnect substrate 120, and the multiple-layered interconnects are connected in parallel, in a linear arrangement along a normal direction via the connecting plugs such as the connecting plug 149 and the like. Then, the second front surface electrode 109 of the silicon chip 110 is connected to the external connecting bump 161 via the multiple-layered interconnects of the ceramic multiple-layered interconnect substrate 120. In addition, the second front surface electrode 109 is connected to the multiple-layered interconnects are via the bump 115 by a short distance. Having the above-described configuration, a larger electric current can be supplied from the external connecting bump 161 to the second front surface electrode 109 through the above-described path (II). In addition, the resistance of the electric current-feed paths can be reduced by arranging the multiple-layered interconnects in parallel. Thus, an improved performance of the power device can be presented.

More specifically, the source electrode of the vertical MOS transistor provided on the silicon chip 110 is connected to the printed circuit board 130 via the above-described path (II), and the gate electrode is connected to the printed circuit board 130 via the above-described path (I). Then, the drain electrode is the back surface electrode 117 provided on the entire back surface of the silicon chip 110, and the back surface electrode 117 is provided so as to contact with an interconnect (not shown) on the printed circuit board 130. Consequently, the vertical MOS transistor provided on the silicon chip 110 has the configuration that preferably functions as the power device.

In addition, the semiconductor device 100 is configured that the connecting plugs such as the connecting plug 149 and the like are provided right above the second front surface electrode 109 of the silicon chip 110, and the second front surface electrode 109 is electrically connected to the external connecting bump 161 via a plurality of interconnect paths in different layers in parallel. Consequently, heat can be released from the second front surface electrode 109 of the silicon chip 110 to the connecting plug 149 and the multiple-layered interconnect structure of the ceramic multiple-layered interconnect substrate 120 with higher efficiency. In the semiconductor device 100, the interconnect structure provided on the ceramic multiple-layered interconnect substrate 120 may be utilized as the heat release path, as well as the electric current-feed path. While it is preferable to dispose a heat release member absorbing transient heat in switching of the power element in vicinity of the silicon chip in the semiconductor device for power applications, the semiconductor device 100 has the arrangement that promotes surely exhibiting higher fin efficiency, by providing the connecting plug right above the front surface electrode on the silicon chip 110.

In addition, the interconnect layer connected to the external connecting bump 163 in the side of the gate electrode is presented as a simple configuration of a dual-layer structure, and the interconnect layer connected to the external connecting bump 161 in the side of the source electrode is presented as a multiple-layered structure, and the connecting plug, which connects these multiple-layered interconnects linearly in a normal direction, is provided in the ceramic multiple-layered interconnect substrate 120, and this is disposed right above the second front surface electrode 109. Consequently, the device is configured that a larger electric current can be flowed into the source electrode of the silicon substrate 101, and heat can be released from the silicon chip 110 toward the ceramic multiple-layered interconnect substrate 120 with an improved efficiency. Semiconductor device 100 is configured that an improved compatibility to applications utilizing larger electric current, a lower resistance and a relatively improved endurance against the temperature variation are presented by utilizing the ceramic multiple-layered interconnect substrate 120 as the current-feed path and the radiation fin. While the interconnect layer connected to the external connecting bump 163 of the gate electrode side is illustrated to be a dual-layer in FIGS. 2A and 2B, the electric current flowed into the gate electrode of the semiconductor chip 110 is considerably smaller than the electric current flowed into the source electrode, and therefore the configuration that an electric current flows through a single layer in the layers of the interconnects may be employed. This can further increase an electric current flowed in the side of the source electrode.

Meanwhile, since a silicon spacer is to be disposed between the silicon chip and the printed circuit board in the conventional flip-chip semiconductor device the back surface of silicon chip is to be exposed. On the contrary, the semiconductor device 100 according to the present embodiment is mounted on the printed circuit board 130 in the condition that the first front surface electrode 107 is opposed to the printed circuit board 130. Consequently, the semiconductor device 100 of the present embodiment is configured to have an improved heat release of the back surface of the silicon chip 110.

In the mean time, U.S. Pat. No. 6,133,634 listed in the description of the background describes a device having a configuration that a silicon die is connected in the condition of facing-up against a carrier of a material such as copper. The configuration of semiconductor device 100 of the present embodiment will be further described below, by comparing with the device described in U.S. Pat. No. 6,133,634.

Figure 7A:
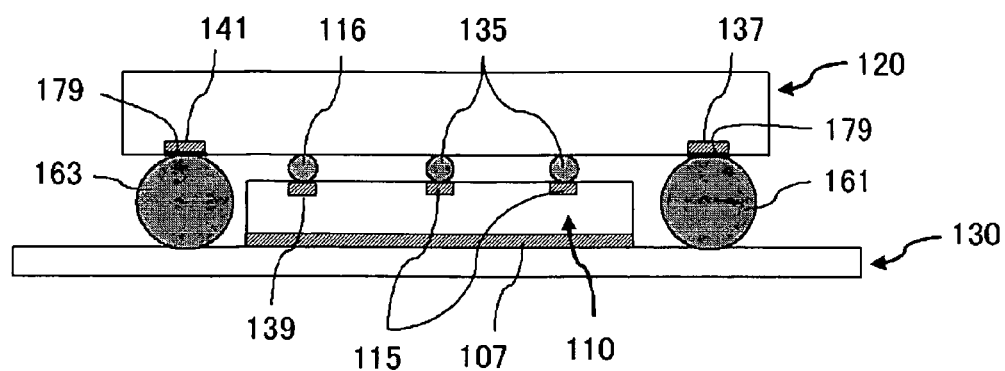
FIG. 7A is a cross-sectional view, illustrating a configuration of the semiconductor device in the embodiment according to the present invention
Figure 7B:
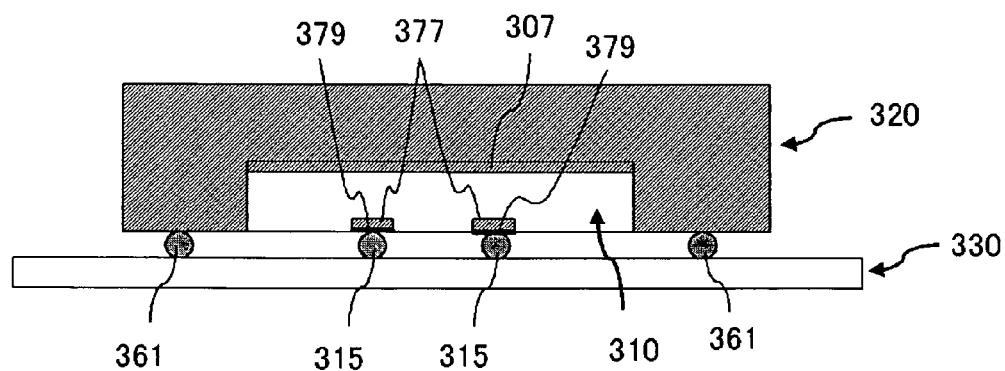
FIG. 7B is a cross-sectional view, illustrating a configuration of a conventional semiconductor device.

FIG. 7A and FIG. 7B are cross-sectional views, useful in comparing the semiconductor device 100 of the present embodiment with the semiconductor device described in U.S. Pat. No. 6,133,634. FIG. 7A is a cross-sectional view, illustrating a simplified cross sectional configuration of the semiconductor device 100 of the present embodiment (FIG. 2A). FIG. 7B is a cross-sectional view, showing a condition that a semiconductor device described in U.S. Pat. No. 6,133,634 is mounted on a printed circuit board. In FIG. 7B, a silicon die 310 is mounted in a concave portion provided in a carrier 320 composed of copper. The silicon die 310 includes front surface electrodes 377 and a back surface electrode 307, and the back surface electrode 307 contacts with a bottom surface of the concave portion of the carrier 320. The element formation surface of the silicon die 310 is located as being coplanar with the front surface of the carrier 320 (appeared as a lower surface in FIG. 7B). The respective front surface electrodes 377 are connected to the interconnects (not shown) on the printed circuit board 330 via bumps 315. In addition, the front surface of the carrier 320 (appeared as a lower surface in FIG. 7B) is connected to an interconnect (not shown) on the printed circuit board 330 via external connecting bumps 361. The detailed description thereof will be made below in reference to these figures.

In the device described in U.S. Pat. No. 6,133,634, the silicon die 310 is carried in the carrier 320 composed of copper as described above. Larger difference in the thermal expansion coefficient is exhibited between copper and silicon. In addition, area of the front surface electrode 377 is considerably smaller as compared with area of the surface of the electroconductive carrier 320, and regions 379 for stress concentration in thermal history after being mounted on the printed circuit board 330 coincide with the front surface electrodes 377 on the silicon die 310. When a geometry of the front surface electrode 377 of the silicon die 310 is designed to be opposed to the carrier 320 according to the above described configuration, resistance for temperature variation will be reduced. In addition, since the whole carrier 320 is composed of electric conductors, only one conduction path is utilized from the back surface electrode 307 of the silicon die 310 through the carrier 320 and the bump 361 to the printed circuit board 330, and thus a plurality of conduction paths cannot be presented.

On the contrary, the semiconductor device 100 of the present embodiment employs the ceramic multiple-layered interconnect substrate 120 corresponding to the carrier 320 is employed as an insulating material including multiple-layered interconnect structure. Consequently, smaller difference in thermal expansion coefficient is between the silicon substrate 101 and the ceramics can be utilized, even if an arrangement that the side of the front surface electrode of the silicon chip 110 is opposed to the ceramic multiple-layered interconnect substrate 120 is employed. Thus, the stress concentration regions 179 are appeared on the front surface of or the vicinity of the fourth interconnect 137 and the fourth interconnect 141. As such, according to the semiconductor device 100, generation of the stress by the thermal history is inhibited, and the stress concentration region 179 is utilized as the front surface of the ceramic multiple-layered interconnect substrate 120 to protect the delicate thin layer provided on the surface of the silicon chip 110, so that a deterioration of the structure in vicinity of the front surface of the silicon chip 110 due to the temperature variation is preferably inhibited.

In addition, the insulating material including the multiple-layered interconnect structure is employed for the ceramic multiple-layered interconnect substrate 120, so that a plurality of conduction paths, namely the above-described path (I) from the first front surface electrode 107 to the interconnect (external interconnect 177 shown in FIG. 6A) of the printed circuit board 130, and the above-described path (II) from the second front surface electrode 109 to another interconnect (external interconnect 175 shown in FIG. 6A) on the printed circuit board 130, can be formed in the ceramic multiple-layered interconnect substrate 120. Further, the multiple-layered interconnect is connected to the connecting plug such as the connecting plug 147 and the like, so that the configuration that is capable of fully ensuring larger electric current, fully reducing the resistance and providing an improved heat release can be presented, even if the ceramic multiple-layered interconnect substrate 120, which corresponds to the carrier 320, is composed of insulating materials.

While the exemplary implementation employing alumina ($Al_2O_3$) for the material of the ceramic multiple-layered interconnect substrate 120 is described in the present embodiment, the materials available for the ceramic multiple-layered interconnect substrate 120 in the present embodiment and the following embodiments may include other ceramics such as silicon nitride (SiN), aluminum nitride (AlN), barium titanate ($BaTiO_3$), mullite ($3Al_2O_3.2SiO_2$) and the like. Selecting silicon nitride (SiN) or aluminum nitride (AlN) for the material of the ceramic multiple-layered interconnect substrate 120 provides further improvement in the heat release characteristics of the ceramic multiple-layered interconnect substrate 120. Consequently, the endurance for the temperature variation in the semiconductor device 100 can be still more improved. Further, the insulating material available for composing the insulating substrate including the multiple-layered interconnect is not limited to the ceramic illustrated in the present embodiment, and an insulating material having a linear expansion coefficient that is closer to the linear expansion coefficient of the silicon chip 110, namely for example, an insulating resin, an insulating silicon or the like, may also be employed.

Here, the linear expansion coefficient of the ceramic multiple-layered interconnect substrate 120 may be selected depending upon the linear expansion coefficient of silicon composing the silicon chip 110 (3.4 ppm/degree C.) and a linear expansion coefficient of the material of the printed circuit board 130 (for example, several tens ppm/degree C., and more specifically approximately 12 to 18 ppm/degree C.). For example, a linear expansion coefficient of ceramic multiple-layered interconnect substrate 120 may be selected to be 3 ppm/degree C. or more and 10 ppm/degree C. or less, and may also be selected according to the material of the printed circuit board 130. Having the value of equal to or higher than 3 ppm/degree C. can provide an improved endurance for the temperature variation in the connecting region to the silicon chip 110. On the other hand, having the value of equal to or lower than 10 ppm/degree C. can provide an improved endurance for the temperature variation in the connecting region to the printed circuit board 130. By selecting a linear expansion coefficient from such range would minimize the stress concentration to the first front surface electrode 107 and the second front surface electrode 109 due to the difference in the coefficient of thermal expansion during a heating process, thereby inhibiting a deterioration of the connecting portions.

In addition, in the present embodiment and the following embodiments, the material available for the through plug 173 extending through the insulating layer that composes the ceramic multiple-layered interconnect substrate 120 may be any conductive materials, and is not limited to metals. For example, a multiple-layered interconnect substrate of an insulating silicon may be employed, in place of employing the ceramic multiple-layered interconnect substrate 120. In this case, the insulating layer may be composed of an insulating silicon and an impurity may be injected into a predetermined region to form a diffusion layer, thereby utilizing the diffusion layer as the through plug 173.

Second Embodiment

While the descriptions in first embodiment are related to the configuration, in which the external mounting terminal provided on the ceramic multiple-layered interconnect substrate 120 is the bump, and this bump is provided on the carrying surface for the silicon chip 110 in the ceramic multiple-layered interconnect substrate 120, The external mounting terminal may be provided in the side that the semiconductor chip of the ceramic multiple-layered interconnect substrate 120 is carried. For example, a conductive member may be exposed in the lower surface of the ceramic multiple-layered interconnect substrate 120, and the exposed surface may be utilized as an external mounting terminal.

Figure 8:
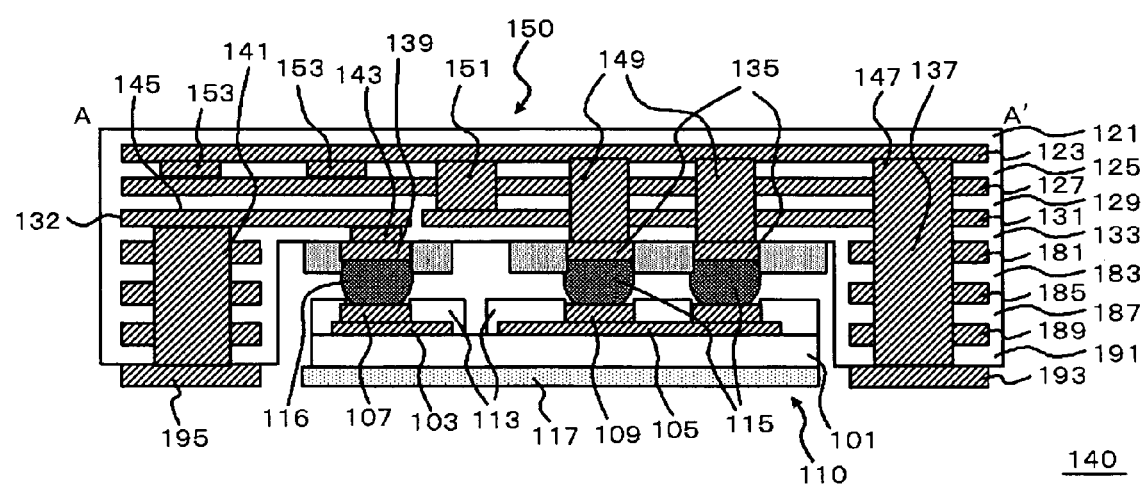
FIG. 8 is a cross-sectional view, illustrating a configuration of a semiconductor device in an embodiment of the present invention.

FIG. 8 is a cross-sectional view, illustrating a configuration of a semiconductor device according to the present embodiment. FIG. 8 presents a view from the same direction as in FIG. 2A. A basic configuration of a semiconductor device 140 shown in FIG. 8 is similar to that of the semiconductor device 100 of first embodiment (FIG. 2A), except that a ceramic multiple-layered interconnect substrate 150 that is employed instead of the ceramic multiple-layered interconnect substrate 120 includes a concave portion, and a silicon chip 110 is disposed in the concave portion. In addition, in the semiconductor device 140, the connecting plug 147 and the connecting plug 145 elongate along a normal direction to the same level as the back surface electrode 117, and an interconnect exposed in the lower surface of the ceramic multiple-layered interconnect substrate 150 functions as an external mounting terminal.

The ceramic multiple-layered interconnect substrate 150 is provided with a fourth interconnect 135, a fourth interconnect 139 and a fourth interconnect 181 on a fourth insulating layer 133 of the ceramic multiple-layered interconnect substrate 120 shown in FIG. 2A. In addition, a fifth insulating layer 183, a sixth insulating layer 187 and a seventh insulating layer 191 are further layered on the fourth insulating layer 133. A fifth interconnect 185; a sixth interconnect 189; and a seventh interconnect 193 and a seventh interconnect 195 are provided: between the fifth insulating layer 183 and the sixth insulating layer 187; between the sixth insulating layer 187 and the seventh insulating layer 191; and on the seventh insulating layer 191 (lower surface of the seventh insulating layer 191 in FIG. 8), respectively. The fifth insulating layer 183, the sixth insulating layer 187 and the seventh insulating layer 191 are provided along three sides of the semiconductor device 140, and form a horseshoe-shaped planar pattern. The seventh interconnect 193 and the seventh interconnect 195 corresponds to the external connecting bump 161 and the external connecting bump 163 of the ceramic multiple-layered interconnect substrate 120, respectively, as shown in FIG. 2A, and function as external mounting terminals.

Figure 9:
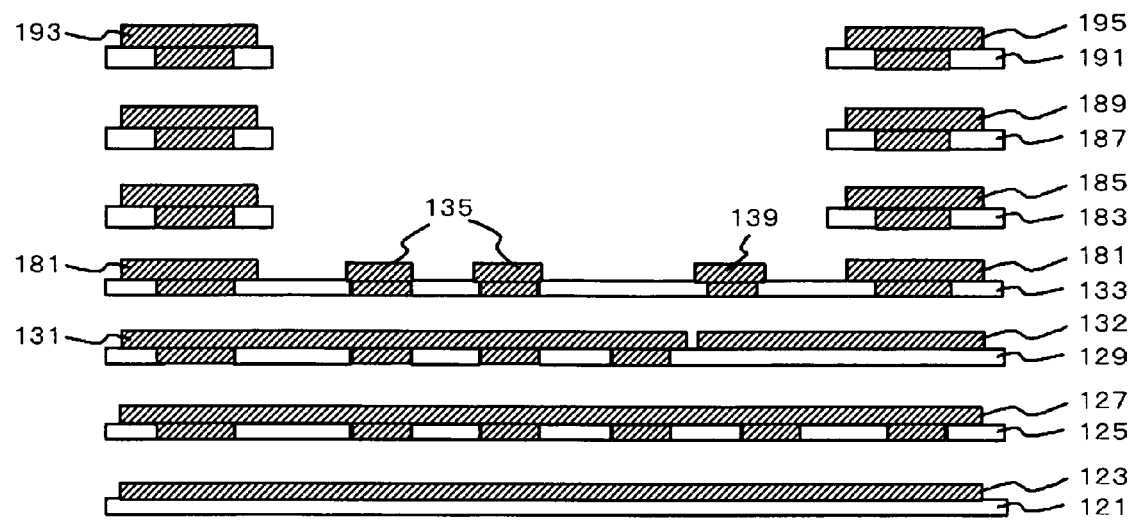
FIG. 9 is a cross-sectional view, useful for describing a method for manufacturing the semiconductor device of FIG. 8.

The process for manufacturing the semiconductor device 100 shown in FIG. 2A may be employed for manufacturing the semiconductor device 140 shown in FIG. 8. FIG. 9 is a cross-sectional view, useful for describing the process for manufacturing the ceramic multiple-layered interconnect substrate 150, and present a diagram corresponding to the process step described above in reference to FIG. 4C. As shown in FIG. 9, when the ceramic multiple-layered interconnect substrate 150 is prepared, alumina sheets for forming the first insulating layer 121 to the seventh insulating layer 191 may be layered and compressively bonded, and then baked, similarly as in first embodiment.

Following advantageous effects are obtained in addition to advantageous effects described in first embodiment by employing the semiconductor device 140 shown in FIG. 8. Since no additional process for providing the external connecting bump 161 and the external connecting bump 163 is required, the manufacturing process can be simplified, and thus the manufacturing cost can be further reduced.

While the preferred embodiments of the present invention have been described above in reference to the annexed figures, it should be understood that the disclosures above are presented for the purpose of illustrating the present invention, and various configurations other than the above-described configurations can also be adopted.

For example, while the exemplary configuration having the silicon chip 110 that includes the vertical MOS transistor has been described in the above-described embodiments, the configuration of the semiconductor chip is not limited thereto. In addition, the configuration of the semiconductor chip is not limited to the configuration including the back surface electrode. For example, configurations having a semiconductor chip, which includes a power device such as a power MOS transistor, a diode and the like, an optical device or a circuit for central processing unit (CPU), may be employed. The configuration, in which the semiconductor chip includes electrodes in the front surface and the back surface thereof and the electric conduction path for flowing electric current along a direction normal to the silicon substrate is achieved, like the vertical MOS transistor, the diode, the optical device or the like, provides an improved durability in the condition of changing the temperature of the front surface electrode, while ensuring the applicability to applications utilizing larger electric current and the lower resistance characteristic. In addition, when the semiconductor chip requiring better heat release characteristics such as circuits for CPU and the like is employed, the element formation surface and the back surface of the semiconductor chip are arranged to be opposed to the ceramic multiple-layered interconnect substrate 120 and the printed circuit board 130, respectively, such that immediate heat release from both surfaces can be achieved, thereby providing an improved heat release characteristics.

In addition, while the exemplary case of the semiconductor device 100 composed of one silicon chip 110 and one ceramic multiple-layered interconnect substrate 120 has been illustrated in the above embodiments, another silicon chip may further be applied on the ceramic multiple-layered interconnect substrate 120. In this case, a conductive member may be exposed in the front surface of the ceramic multiple-layered interconnect substrate 120, so that a lower surface of the silicon chip on the ceramic multiple-layered interconnect substrate 120 and an upper surface of the ceramic multiple-layered interconnect substrate 120 can be conducted by a shorter distance. Consequently, the semiconductor device 100 can also be preferably employed for a module having a stack structure that includes a layered structure of a plurality of silicon chips along a normal direction.

In addition, while the exemplary configuration, in which the entire back surface of the ceramic multiple-layered interconnect substrate 120 or the ceramic multiple-layered interconnect substrate 150 (upper surface in FIG. 2A or FIG. 7) is the first insulating layer 121, has been illustrated in the above embodiments, a configuration having a conductive member connecting to the first interconnect 123 is exposed in a portion of the back surface of the ceramic multiple-layered interconnect substrate 120 or the ceramic multiple-layered interconnect substrate 150 may also be employed. When other heat release member or a grounding member is further applied on the ceramic multiple-layered interconnect substrate 120, the conduction thereof with the interconnect in the ceramic multiple-layered interconnect substrate 120 can be avoided, by providing an insulation to the entire back surface of the ceramic multiple-layered interconnect substrate 120 or the ceramic multiple-layered interconnect substrate 150. On the other hand, a conductive member may be provided in a portion of the back surface of the ceramic multiple-layered interconnect substrate 150, so that the conduction path between the semiconductor chip and the external interconnect can be reduced when other semiconductor chip is further applied on the ceramic multiple-layered interconnect substrate 120 or the ceramic multiple-layered interconnect substrate 150.

In addition, while the exemplary configuration, in which the passivation film 113 is divided into the region including the first pad 103 and the region including the second pad 105, has been illustrated in the above embodiments (FIG. 2A, FIG. 8), the passivation film 113 may be divided into a plurality of regions, or may be not divided. In addition, the material for the passivation film 113 may be an oxide film such as $SiO_2$ film or a nitride film such as SiN film, in place of the organic compound insulating film such as polyimide film and the like exemplified in first embodiment. Further, a phosphorus glass (PSG) film may also be employed. Further, the passivation film 113 may be monolayer, or may be a multi-layered film formed by layering a plurality of films.

In addition, while the exemplary configuration, in which the protective films 155 are provided on the ceramic multiple-layered interconnect substrate 120 and the ceramic multiple-layered interconnect substrate 150 concerning the surface opposed to the silicon chip 110, has been illustrated in the above embodiments, a configuration, in which these ceramic multiple-layered interconnect substrates includes no protective film 155 may also be employed.

In addition, while the exemplary configuration, in which the through plugs such as the connecting plug 149 and the like are provided only in the region right above the front surface electrode, has been illustrated in the above embodiments, the through plug may also be provided in other regions except the region right above the front surface electrode or the bump, and a plurality of such through plugs can be disposed.

It is apparent that the present invention is not limited to the above embodiments, that may be modified or changed without departing from the scope and spirit of the invention.

What is claimed is:

1. A semiconductor device, comprising:
   an insulating substrate;
   a semiconductor chip flip-bonded to a chip-carrying region of said insulating substrate; and
   an external mounting terminal located in a side of said insulating substrate, on which said semiconductor chip is carried,
   wherein said semiconductor chip includes a front surface electrode located on an element formation surface of the semiconductor chip and a back surface electrode located on a back surface of the semiconductor chip,
   wherein said insulating substrate includes an interconnect layer composed of a conductive material,
   wherein said interconnect layer comprises a multiple-layered interconnects located on a front surface and in an interior of said insulating substrate,
   wherein said front surface electrode of said semiconductor chip is electrically connected to said external mounting terminal through the multiple-layered interconnects in said multiple-layered interconnect layer,
   wherein said back surface electrode is electrically connected to a terminal of at least one device located in an interior of said semiconductor chip,
   wherein said insulating substrate comprises a concave portion and said semiconductor chip is disposed in the concave portion of said insulating substrate, and wherein at least a first electroconductive through plug, which elongates along a normal direction to a same level as said back surface electrode of said semiconductor chip and provides a connection between said multiple-layered interconnects, is located in said insulating substrate.

2. The semiconductor device according to claim 1, wherein said front surface electrode is electrically connected to said external mounting terminal through said multiple-layered interconnects of different layers that are mutually electrically connected.

3. The semiconductor device according to claim 1, wherein at least a second electroconductive through plug that provides a connection between said multiple-layered interconnects is located in said insulating substrate.

4. The semiconductor device according to claim 3, wherein said second electroconductive through plug is located right above said front surface electrode.

5. The semiconductor device according to claim 1, wherein said external mounting terminal is an electroconductive bump located lateral to said semiconductor chip.

6. The semiconductor device according to claim 5, wherein said front surface electrode is bump-bonded to an interconnect in said interconnect layer and said semiconductor chip is flip-bonded to said insulating substrate, and wherein said external mounting terminal is a bump that is larger than the bump connecting said front surface electrode to said interconnect.

7. The semiconductor device according to claim 1, wherein a linear expansion coefficient of said insulating substrate is equal to or more than 3 ppm/degree C. and equal to or less than 10 ppm/degree C.

8. The semiconductor device according to claim 1, wherein said semiconductor device comprises a plurality of said front surface electrodes and a plurality of said external mounting terminals, wherein said semiconductor chip includes a vertical metal oxide semiconductor (MOS) transistor, wherein said front surface electrode electrically connected to said external mounting terminal through the multiple-layered interconnects in said multiple-layered interconnect layer is a source electrode of said vertical MOS transistor and wherein said back surface electrode is a drain electrode of said vertical MOS transistor.

9. The semiconductor device according to claim 1, wherein said insulating substrate comprises a ceramic material selected from silicon nitride or aluminum nitride.

10. The semiconductor device according to claim 1, wherein said insulating substrate is an insulating silicon substrate, and wherein at least said second electroconductive through plug comprises doped silicon.

11. A semiconductor device, comprising:
an insulating substrate including a multiple-layered interconnects, a first external mounting terminal, a second external mounting terminal, and a chip-carrying region formed on a side on which the first and second external mounting terminals are located; and
a semiconductor chip flip-bonded to the chip-carrying region of the insulating substrate, the semiconductor chip including a vertical metal oxide semiconductor transistor, a first front surface electrode, a second front surface electrode, and a third external mounting terminal
wherein the first external mounting terminal and the second external mounting terminal are located on the insulating substrate,
wherein the first front surface electrode and the second front surface electrode are located on a front surface of the semiconductor chip,
wherein the third external mounting terminal is located on a back surface of the semiconductor chip,
wherein each of the first surface electrode, the second surface electrode and the third external mounting terminal is electrically connected to a corresponding terminal of the vertical metal oxide semiconductor transistor, and
wherein the first front surface electrode and the second front surface electrode of the semiconductor chip are electrically connected to the first mounting terminal and the second external mounting terminal through the multiple-layered interconnects, respectively,
wherein said insulating substrate comprises a concave portion and said semiconductor chip is disposed in the concave portion of said insulating substrate, and
wherein at least a first electroconductive through plug, which elongates along a normal direction to a same level as said third external mounting terminal of said semiconductor chip and provides a connection between said multiple-layered interconnects, is located in said insulating substrate.

12. The semiconductor device according to claim 11, wherein the first front surface electrode is electrically connected to the first external mounting terminal through the multiple-layered interconnects of different layers that are mutually electrically connected.

13. The semiconductor device according to claim 11, wherein the multiple-layered interconnects includes at least a second electroconductive through plug that provides a connection between a plurality of layers of the multiple-layered interconnect layer.

14. The semiconductor device according to claim 13, wherein the second electroconductive through plug is located right above the first front surface electrode of the semiconductor chip.

15. The semiconductor device according to claim 11, wherein each of the first and second external mounting terminals is formed of an electroconductive bump located lateral to the semiconductor chip.

16. The semiconductor device according to claim 15, wherein the first and second front surface electrodes are bump-bonded to respective interconnects in the multiple-layered interconnects and the semiconductor chip is flip-bonded to the insulating substrate, and wherein each of the electroconductive bump is larger than each of the bumps connecting the first and second front surface electrodes to the respective interconnects.

17. The semiconductor device according to claim 11, wherein a linear expansion coefficient of the insulating substrate is equal to or more than 3 ppm/degree C. and equal to or less than 10 ppm/degree C.

18. The semiconductor device according to claim 11, wherein the first front surface electrode, the second front surface electrode and a third external mounting terminal are a source electrode, a gate electrode and a drain electrode of the vertical metal oxide semiconductor transistor, respectively.

19. The semiconductor device according to claim 11, wherein said insulating substrate comprises a ceramic material selected from silicon nitride or aluminum nitride.

20. The semiconductor device according to claim 11, wherein said insulating substrate is an insulating silicon substrate, and wherein at least said second electroconductive through plug comprises doped silicon.

* * * * *